United States Patent
Tsai et al.

(10) Patent No.: US 7,999,273 B2
(45) Date of Patent: Aug. 16, 2011

(54) LIGHT EMITTING DEVICE HAVING PILLAR STRUCTURE WITH ROUGHNESS SURFACE AND THE FORMING METHOD THEREOF

(75) Inventors: Tzong-Liang Tsai, Taichung (TW); Lin-Chieh Kao, Taichung (TW)

(73) Assignee: HUGA Optotech Inc., Taichung (TW)

( * ) Notice: Subject to any disclaimer, the term of this patent is extended or adjusted under 35 U.S.C. 154(b) by 39 days.

(21) Appl. No.: 12/414,753

(22) Filed: Mar. 31, 2009

(65) Prior Publication Data

US 2010/0237357 A1 Sep. 23, 2010

(30) Foreign Application Priority Data

Mar. 20, 2009 (TW) .............................. 98109027 A (51) Int. Cl.
*H01L 33/00* (2010.01)
(52) U.S. Cl. ............... 257/95; 257/98; 257/99; 257/100
(58) Field of Classification Search .................... 257/95, 257/98, 99, 100
See application file for complete search history.

(56) References Cited

U.S. PATENT DOCUMENTS

| 7,166,870 | B2 * | 1/2007 | Erchak et al. | 257/86 |
| 7,345,321 | B2 * | 3/2008 | Wu et al. | 257/99 |
| 2005/0202581 | A1 * | 9/2005 | Sugawara | 438/39 |
| 2006/0234408 | A1 * | 10/2006 | Lee et al. | 438/22 |
| 2008/0303018 | A1 * | 12/2008 | Kim et al. | 257/13 |

* cited by examiner

*Primary Examiner* — Tan N Tran
(74) *Attorney, Agent, or Firm* — Jianq Chyun IP Office (57) ABSTRACT

A light emitting device is provided which includes a substrate, a first semiconductor layer having a first region and a second region on the substrate; ac active layer is formed on the first region of the first semiconductor layer; a second semiconductor layer is formed on the active surface layer and the portion surface of the second semiconductor layer is a rough surface; a plurality of pillar structures with a hollow structure, and both of the outer surface and inner surface of the pillar structures are rough surface; a transparent conductive layer is formed to cover the plurality of pillar structures; a first electrode is formed on the transparent conductive layer; and a second electrode is formed on the second region of the first semiconductor layer.

18 Claims, 9 Drawing Sheets

LIGHT EMITTING DEVICE HAVING PILLAR STRUCTURE WITH ROUGHNESS SURFACE AND THE FORMING METHOD THEREOF

BACKGROUND OF THE INVENTION

1. Field of the Invention

The present invention is a light emitting device, and more particularly is to form a plurality of pillar structure with hollow structure therein to increase the light extraction efficiency of the light emitting device.

2. Description of the Prior Art

The major reason for the lower output of illumination efficiency of the optical device, such as light emitting device, is the light extraction efficiency of the light extraction which is insufficient. That is to say, the actual illumination is emitted from the light emitting device that is part of the illumination of the active layer. Thus, a photon element is utilized in the light emitting device to improve the light extraction efficiency of the light emitting device in the conventional technology.

Figure 1A:
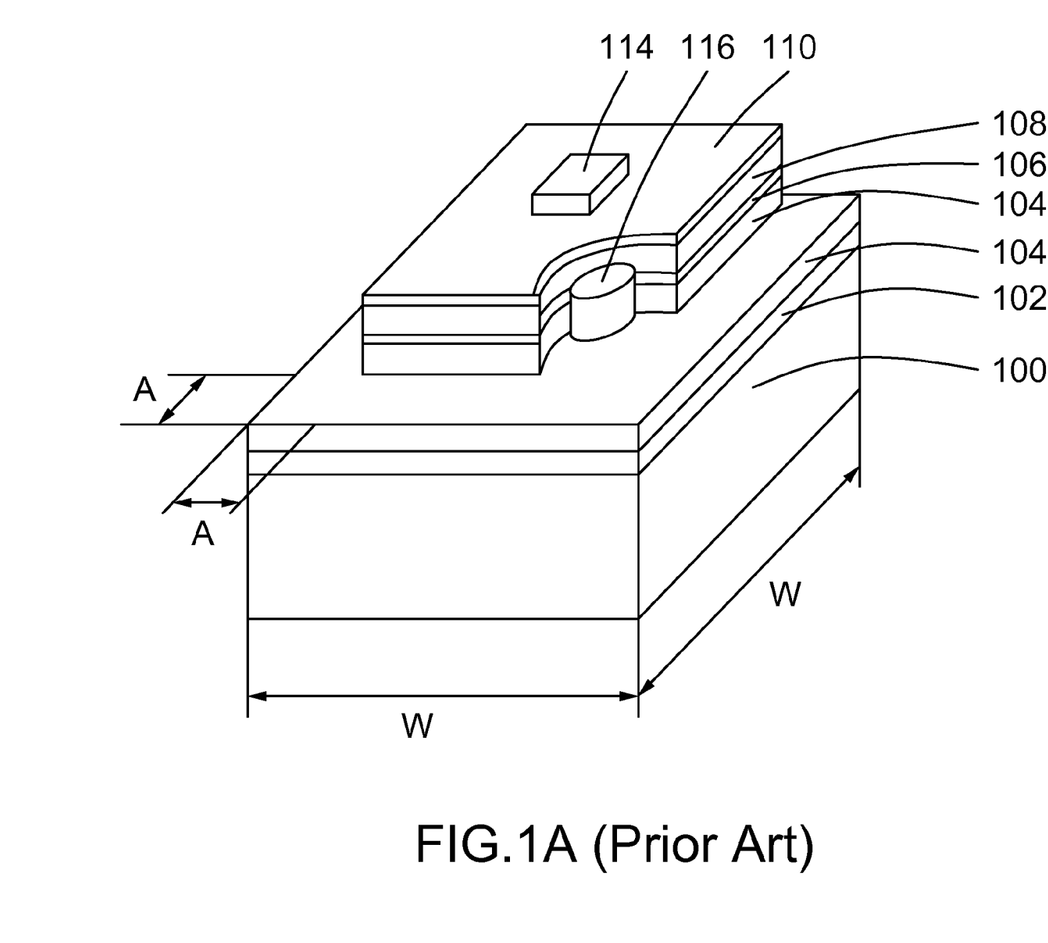
FIG. 1A to FIG. 1B are views of showing light emitting device in accordance with the conventional prior art.

In the past, as shown in FIG. 1A, the semiconductor light emitting device with blue light includes a sapphire substrate 100; a GaN buffer layer 102 is disposed on the sapphire substrate 100; a n-type GaN semiconductor layer 104 is formed on the GaN buffer layer 102. Because the band gap of the active layer 106 is smaller than the band gap of the n-type GaN semiconductor layer 104, thus, the material of the active layer 106 can be InGaN compound semiconductor layer. The n-type semiconductor layer 104, the active layer 106, and p-type semiconductor layer 108 can be stacked to server as a semiconductor stacked layer. Next, a transparent conductive layer 110 is formed on the P-type semiconductor layer 108, and a p-side electrode 114 is disposed on the surface of the transparent conductive layer 110, and the n-side electrode 116 is disposed on the exposed surface of the n-type GaN semiconductor layer 104. In order to increase the closed efficiency for the carrier, the AlGaN with large band-gap can be used for the material of n-type GaN semiconductor layer 104 and P-type semiconductor layer 108 on the active layer 106.

Figure 1B:
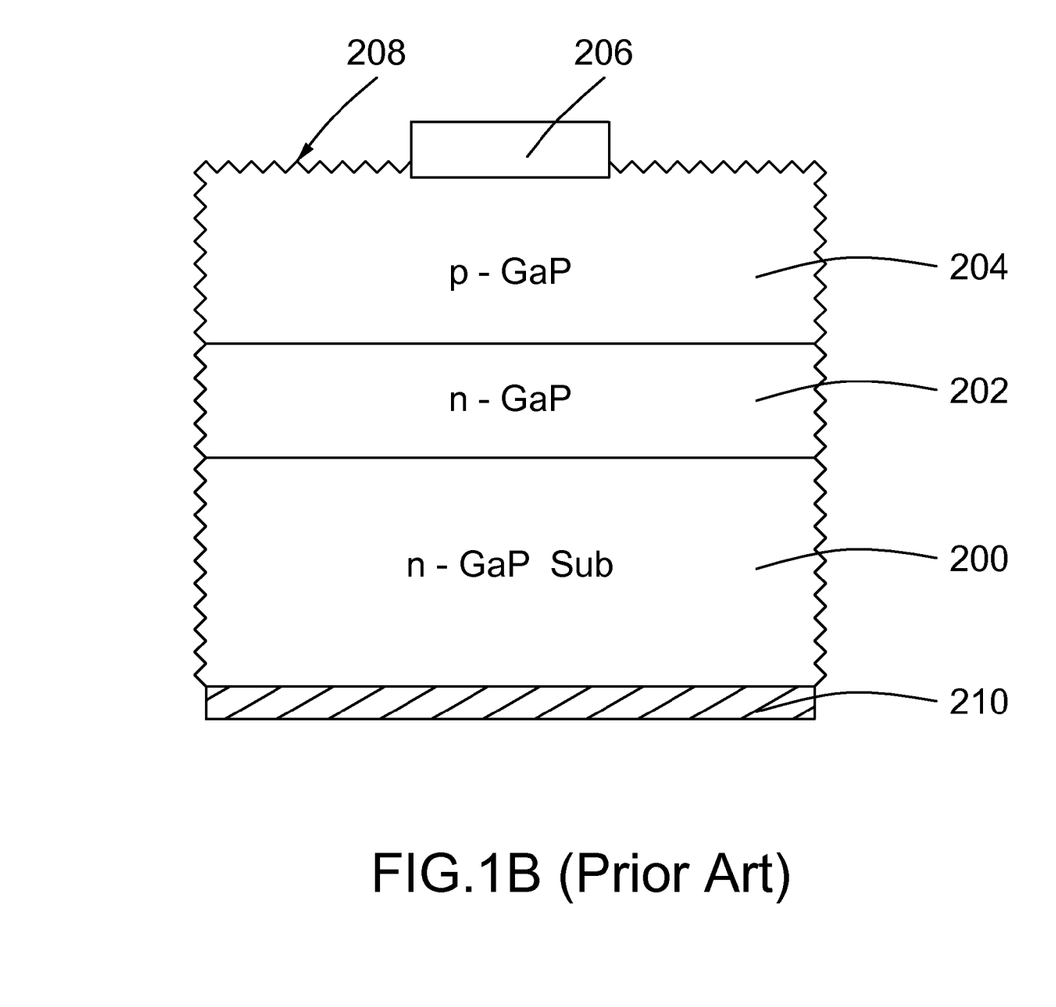

In order to form the n-side electrode 116, the portion of semiconductor layer 108 is removed to expose the portion surface of the n-type semiconductor layer 104, and the width W is also formed by removing a portion of peripheral of light emitting device. Due to the hardness of the material of GaN semiconductor layer on the peripheral of the light emitting device is difficult to saw or carve, the formation of the active layer 106 is formed by dry etching process to avoid the crack is generated within the active layer 106. Further, the reflective index (reflective index is 2.5) of the GaN semiconductor layer is equally to the other compound semiconductor layer, and the reflective index is larger than the air (the reflective index is 1.0), and thus, the light is emitted from the active layer 106 through the semiconductor layer 108 to the air (not shown) that would be induced the total reflection, so as to the light would not emitted from the semiconductor layer 108 to the outside. Thus, the light is reflected repeatedly to increase within the semiconductor layer to decay of the illumination, so that the light extraction efficiency is decreased to 10%. In order to solve the light extraction efficiency of the light emitting device, as shown in FIG. 1B, in the GaP, AlGaInP, AlGaAs compound semiconductor layer, the concave and raised structure is formed around the peripheral of the light emitting device, so that the light can be extracted from the semiconductor stacked layer to the outside. As shown in FIG. 1B, the n-type GaP layer 202 and p-GaP layer 204 is formed as the semiconductor stacked layer, and p-side electrode 206 is disposed on the surface of the semiconductor stacked layer, and n-side electrode 210. After die sawing process, a plurality of LED die can be obtained, and an etching process such as hydrochloric acid (HCl) solution to form the rough surface among the concave and raised structure of the surface of the LED die.

In order to increase the light emitting efficiency, the current is applied to the electrode to increase the current density, but the reliability and usage life of the light emitting device would be decreased.

SUMMARY OF THE INVENTION

According to the problems described above, the main object of the present invention is to provide a plurality of pillar structures with a hollow structure in the light emitting device to increase the light extraction efficiency for the light emitting device.

Another object of the present invention is to increase the scattering efficiency of the light emitting device by the hollow structure with different depth to increase the light extraction efficiency for the light emitting device.

According to above objects, the present invention provides a light emitting device, which includes a substrate; a first semiconductor layer having a first region and a second region, and is formed on the substrate; an active layer is formed on the first region of the first semiconductor layer and a second semiconductor layer is formed on the active layer and having a plurality of pillar structures with a hollow structure therein; a transparent conductive layer covering a plurality of pillar structures with a hollow structure; a first electrode is disposed on the transparent conductive layer; and a second electrode is disposed on the second region of the first semiconductor layer.

In addition, the present invention also provides a light emitting device, which includes a substrate; a first semiconductor layer having a first region and a second region which is formed on the substrate; an active layer is formed on the portion of first region of the first semiconductor layer; a second semiconductor layer is formed on the active layer and the portion surface of the second semiconductor layer is a rough surface; a plurality of pillar structures with a hollow structure is formed on the portion surface of the second semiconductor layer, and the outer surface of the plurality of pillar structures and the inner surface of the hollow structure are rough surface; a transparent conductive layer covering the plurality of pillar structure; a first electrode is disposed on the transparent conductive layer and a second electrode is disposed on the second region of the first semiconductor layer.

The present invention also provides another light emitting device, which includes a substrate having a top surface and a bottom surface; a first semiconductor layer is formed on the top surface of the substrate; an active layer is formed on the first semiconductor layer; a second semiconductor layer is formed on the active layer and having a plurality of pillar structures with a hollow structure therein; a transparent conductive layer covering the plurality of pillar structures; a first electrode is disposed on the bottom surface of the substrate; and a second electrode is disposed on the transparent conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2A:
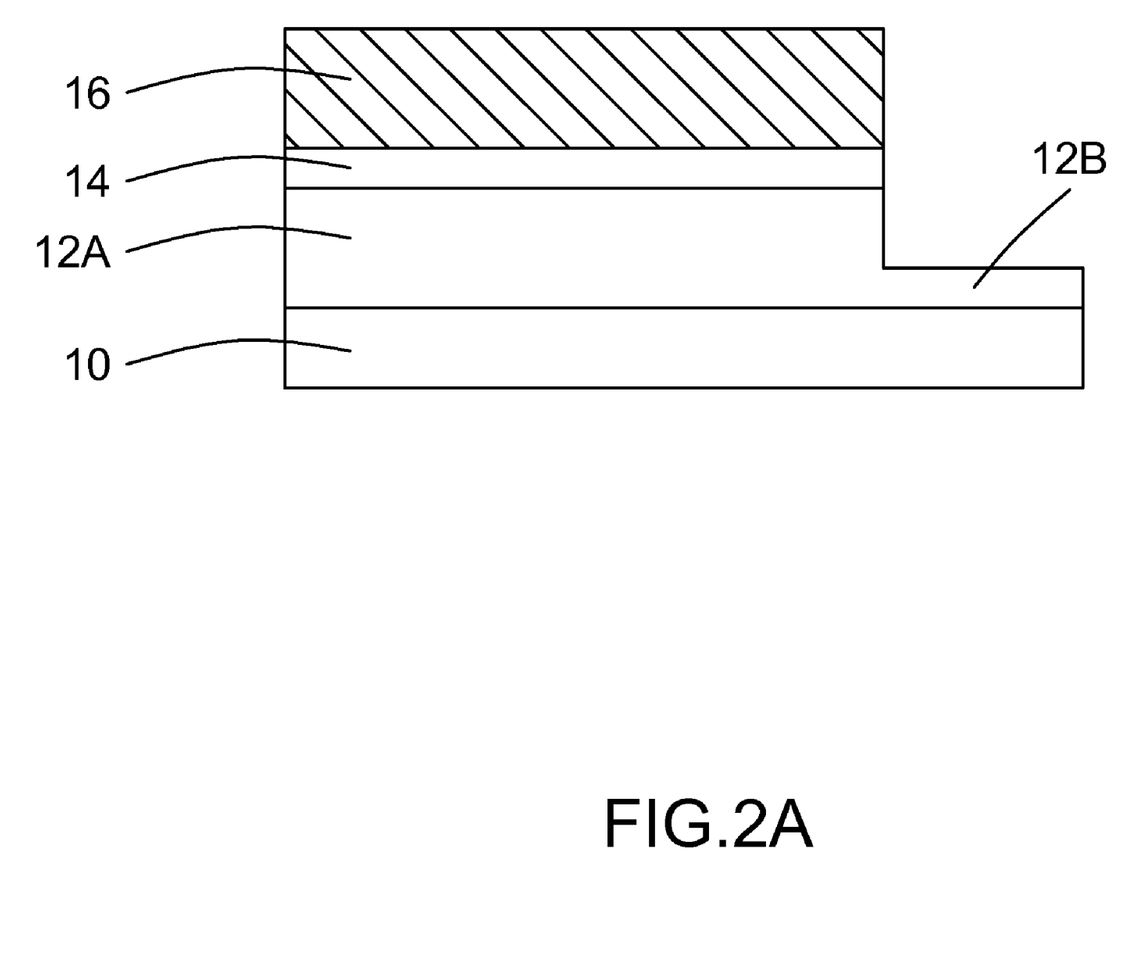
FIG. 2A shows a view of a light emitting device in accordance with the present invention.
Figure 2B:
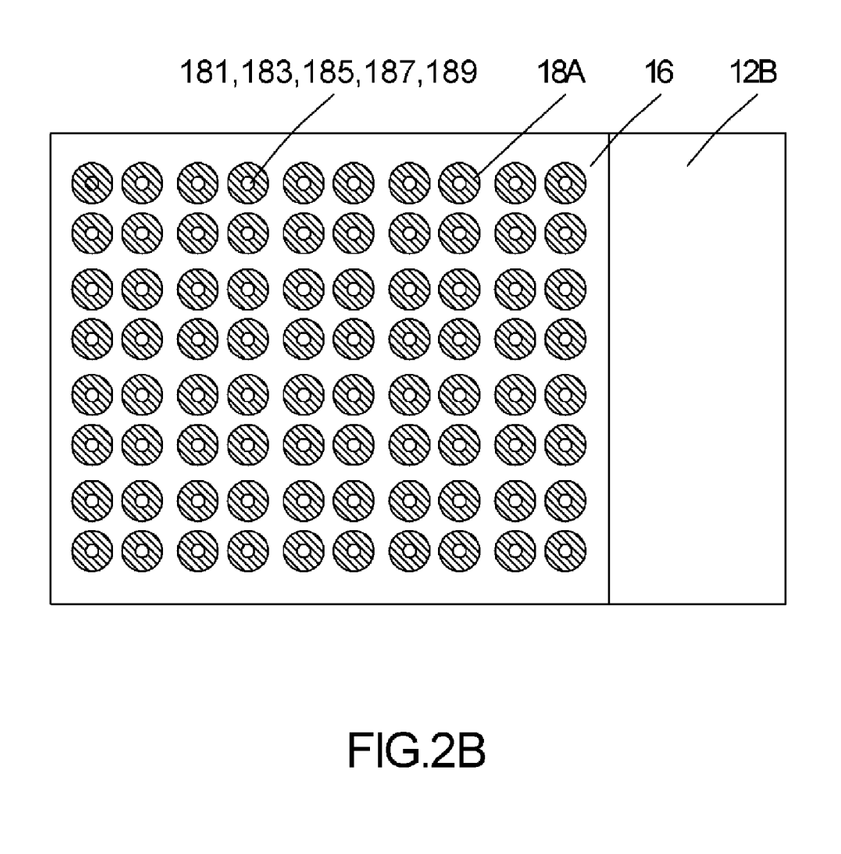
FIG. 2B shows a vertical view of a plurality of pillar structure with hollow structure therein in accordance with the present invention.

FIG. 2A to FIG. 2B is view showing an embodiment of a plurality of pillar structures with a hollow structure in a light emitting device of the present invention. The semiconductor structure of includes a substrate 10 of sapphire in MOVPE. A buffer layer (not shown), such as a multi-strain releasing layer, is formed on the substrate 10. In the embodiment, the buffer layer has a compound layer (not shown) and a V-II group compound layer (not shown). The compound layer is on the substrate 10 and gallium nitride based, such as AlGaN. For the substrate 10, it is selected from the group consisting of: sapphire, $MgAl_2O_4$, GaN, AlN, SiC, GaAs, AlN, GaP, Si, Ge, ZnO, MgO, LAO, LGO and glass material.

Next, a semiconductor epi-stacked structure is formed on the buffer layer (not shown), which includes a first semiconductor layer 12 on the buffer layer, an active layer 14 on the first semiconductor layer 12, and a second semiconductor layer 16 on the active layer 14. The first semiconductor layer 12 and the second semiconductor layer 16 are made of III-V group compound of nitride-based material. Furthermore, the first semiconductor layer 12 and the second semiconductor layer 16 have different electric conductive for example, the first semiconductor layer 12 of N-type associated with the second semiconductor layer 16 of P-type.

In addition, when the first semiconductor layer 12 is an N-type semiconductor conductive layer, the second semiconductor layer 16 must be P-type semiconductor layer. It is very clear to know that the active layer 14 is formed between the N-type semiconductor layer 12 and the P-type semiconductor layer 16. The electrons and holes between the N-type semiconductor layer 12 and the P-type semiconductor layer 16 will be driven to the active layer 14 by adding some voltage and the recombination is generated to emit the light.

Thus, the epi-stacked structure of the light emitting device is not limited to the first gallium nitride (GaN) based semiconductor layer 14 of N-type or the second gallium nitride based semiconductor layer 16 of P-type, and any suitable types may be used. In the case of the second gallium nitride based semiconductor layer 16 of P-type, the first gallium nitride based semiconductor layer 14 is P-type, reversely too. Moreover, the epi-stacked structure of the light emitting device may be used as one basic epi-stacked structure of LED, laser, photo-detector, or VCSEL.

Then, the semiconductor process such as lithography process and etch process are performed, a patterned photoresist layer (not shown) is formed on the second semiconductor layer 16; next, an etching process is performed to remove the portion of the second semiconductor layer 16, the active layer 14, and the first semiconductor layer 12 to expose the portion of the first semiconductor layer 12, so that the epi-stacked structure having a first region 12A and a second region 12B on the substrate 10.

Next, the semiconductor process such as lithography process and etch process is performed again after the epi-stacked structure (the first semiconductor layer 12, the active layer 14, and the second semiconductor layer 16) is formed on the substrate 10. Another patterned photoresist layer (not shown) is formed on the second semiconductor layer 16 of the epi-stacked structure to form a plurality of pillar structure 18 with a hollow structure therein. In this embodiment, a suitable current is applied to the electrodes on the first semiconductor layer 12 and the second semiconductor layer 16 can drive the active layer 14 to illuminate respectively, and the light extraction efficiency of the light emitting device can be improved due to the light scattering effective within the plurality of pillar structures 18 with hollow structure.

FIG. 2B shows a top view of the plurality of pillar structures with a hollow structure. In FIG. 2B, the pillar structures 18 with hollow structure are formed on the portion of the second semiconductor layer 16, wherein the hollow structure of the pillar structures 18 may have different depth 181, 183, and 185. In addition, the portion of the first semiconductor layer 12 is exposed. In this embodiment, the exposed region of the first semiconductor layer 12 is a second region 12B which is used for forming a first electrode (not shown) thereon.

Figure 3:
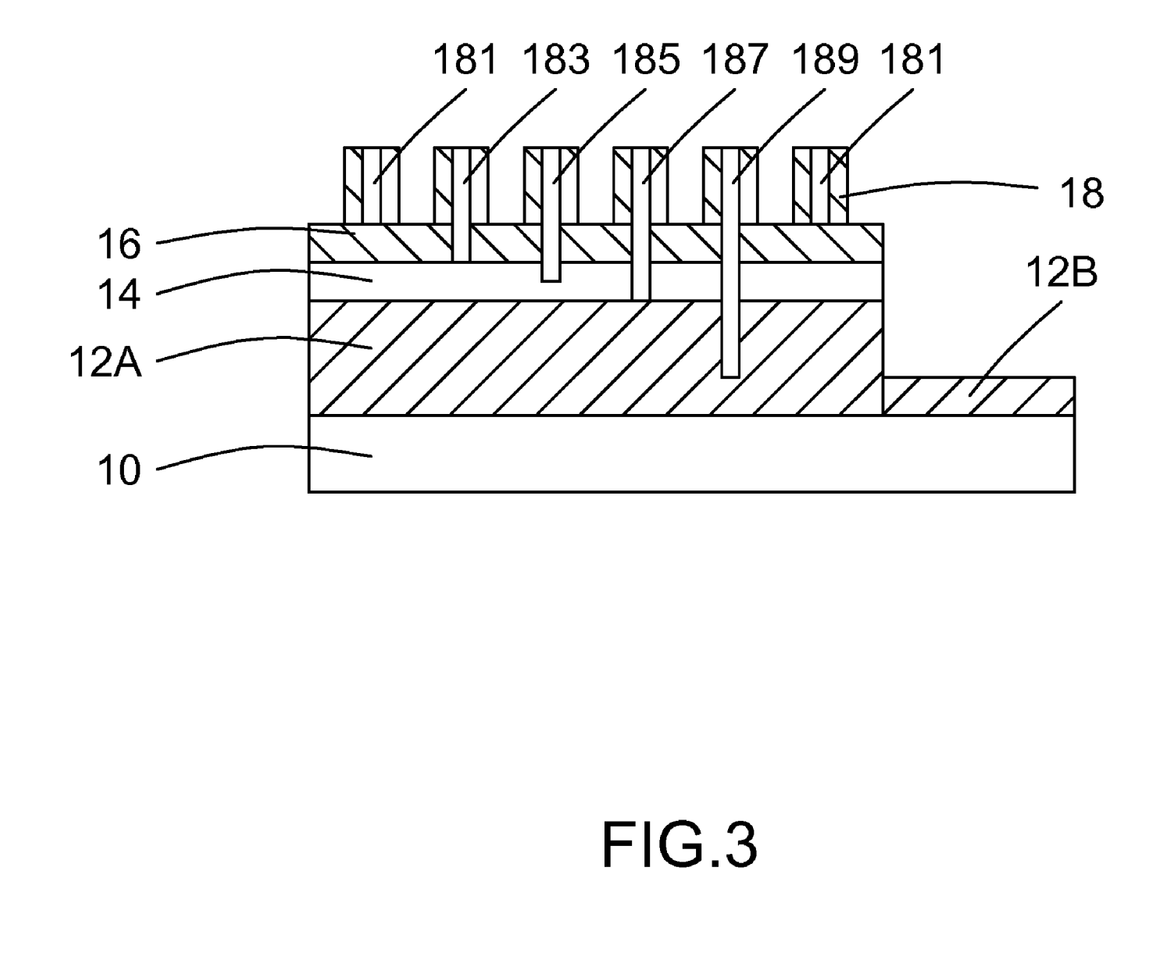
FIG. 3 shows a view of a plurality of pillar structures with hollow structure which having different depth in accordance with the present invention.

Thereafter, FIG. 3 shows a view of a plurality of pillar structures with hollow structure therein. In FIG. 3, the depth 181 of the hollow structure of the pillar structures 18 is down from the second semiconductor layer 16 to an arbitrary depth of the second semiconductor layer 16. In another embodiment, the depth 183 of the hollow structure can be selected down from the second semiconductor layer 16 to expose the surface of the active layer 14; or the depth 185 of the hollow structure of the pillar structure 18 is down from the second semiconductor layer 16 to an arbitrary depth of the active layer 14. in addition, the depth 187 of the hollow structure can be selected down from the second semiconductor layer 16 through the active layer 14 to expose the surface of the first semiconductor layer 12; or the depth 189 of the pillar structure is down from the second semiconductor layer 16 through the active layer 14 to an arbitrary depth of the first semiconductor layer 12. It is noted that, in the present invention, each depth (181, 183, 185, 187, and 189) of hollow structure of each plurality of pillar structures 18 has the same depth. In another embodiment of the invention, each depth (181, 183, 185, 187, and 189) of the hollow structure of each plurality of pillar structures 18 has different depth. Thus, according to above discussion, for the purpose of the depth (181, 183, 185, 187, and 189) of the hollow structure of the plurality of pillar structures 18 is used for increasing the light scattering efficiency within the pillar structures 18, in which the light is emitted from the active layer 14 in the epi-stacked structure.

Figure 4A:
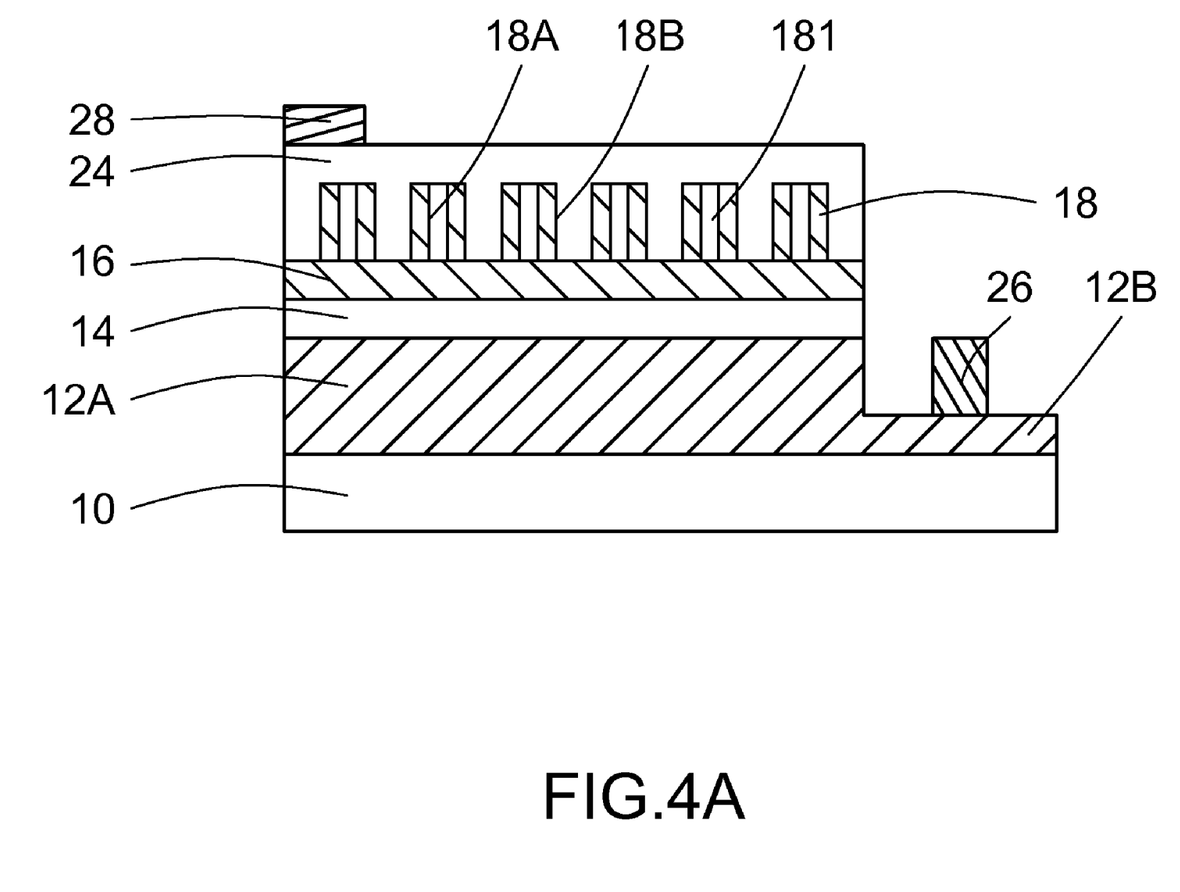
FIG. 4A shows a view of a light emitting device having a plurality of pillar structures with hollow structure therein in accordance with the present invention.

FIG. 4A shows a view of a light emitting device that having a plurality of pillar structures with a hollow structure. In FIG. 4A, an epi-stacked structure is formed on the substrate 10, in which the epi-stacked structure includes: a first semiconductor layer 12 on the substrate 10; an active layer 14 on the first semiconductor layer 12 and the second semiconductor layer 16 on the first semiconductor layer 14. It is noted that the manufacture process of the epi-stacked structure is well known in the description above, therefore, the detail description of the manufacture process is omitted herein. Next, the present invention utilized the depth 181 of the hollow structure that is equal to the height of the pillar structure 18 (as shown in FIG. 3) to illustrate as following.

After the plurality of pillar structures 18 with a depth 181 of the hollow structure is formed on the second semiconductor layer 16, a transparent conductive layer 24 is formed on the second semiconductor layer 16 and a transparent conductive layer 24 is formed to cover the plurality of pillar structures 18 with hollow structure 181. In this embodiment, the thickness of the transparent conductive layer 24 is about 2500 angstrom, and the material of the transparent conductive layer 24 can be Ni/Au, NiO/Au, Ta/Au, TiWN, TN, Indium Tin Oxide, Chromium Tin Oxide, Antinomy doped Tin Oxide, Zinc Aluminum Oxide and Zinc Tin Oxide.

Next, a first electrode 26 is formed on the exposed surface (second region 12B) of the portion of the first semiconductor layer 12, and the material of the first electrode 26 can be Au/Ge/Ni, Ti/Al, Tl/Al/Ti/Au or Cr/Au alloy or combination thereof. Then, a second electrode 28 with thickness of about 2000 um is formed on the transparent conductive layer 24. In this embodiment, the material of second semiconductor layer 16 is a P-type GaN semiconductor layer, thus, the material of the second electrode 28 can be Au/Ge/Ni, Ti/Al, Tl/Al/Ti/Au, Cr/Au alloy or W/Al alloy.

Figure 4B:
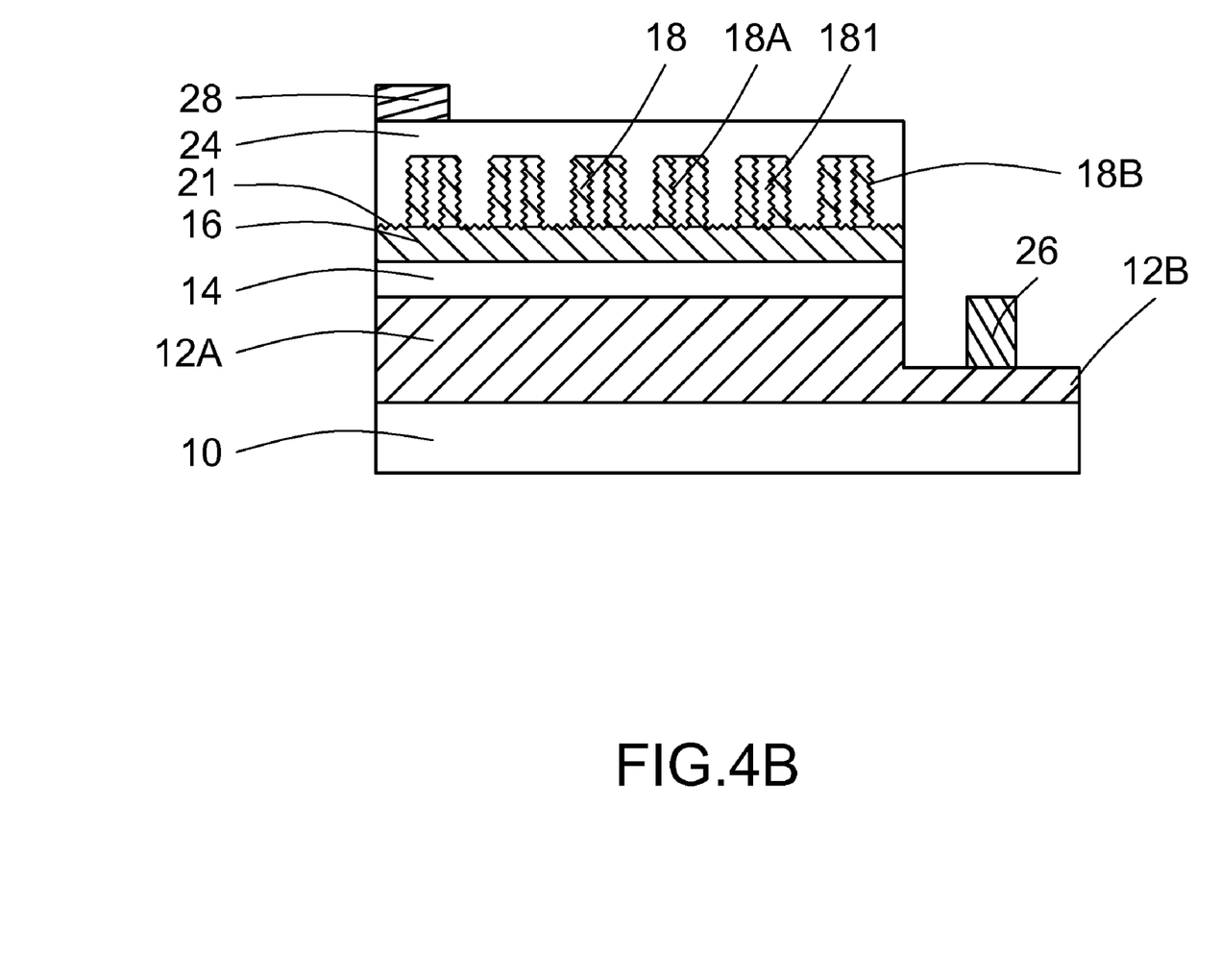
FIG. 4B shows a view of another embodiment of light emitting device having a plurality of pillar structures with hollow structure, and the rough surface is formed on the outer surface of plurality of pillar structures and on the inner surface of the hollow structure in accordance with the present invention.

In addition, FIG. 4B shows a view of another embodiment of light emitting device having a plurality of pillar structures with a hollow structure, and a rough surface is formed on the outer surface of the plurality of pillar structure and on the inner surface of hollow structure. In FIG. 4B, an epi-stacked structure is formed on the substrate 10, which includes: a first semiconductor layer 12 on the substrate 10; an active layer 14 on the first semiconductor layer 12 and a second semiconductor layer 16 on the active layer 14. It should be noted that the manufacture process of the epi-stacked structure is well known in the description above, therefore, the detail description of the manufacture process is omitted herein. Next, the present invention utilized the depth 181 of the hollow structure is equal to the height of the pillar structure 18 (as shown in FIG. 3) to illustrate as following.

After the plurality of pillar structures 18 with the hollow structure is formed on the second semiconductor layer 16, a photon assisted etching process is performed to form a rough surface 21 over the exposed surface of the second semiconductor layer 16 and the inner surface 18A and outer surface 18B of the plurality of pillar structures 18. Thus, according to above discussion, the purpose of the rough surface 21 is used for increasing the light extraction efficiency, in which the light is emitted from the active layer 14.

Then, a transparent conductive layer 24 is formed on the second semiconductor layer 16 and to cover the plurality of pillar structures 18 with hollow structure 181. In this embodiment, the thickness of the transparent conductive layer 24 is about 2500 angstrom, and the material of the transparent conductive layer 24 can be Ni/Au, NiO/Au, Ta/Au, TiWN, TN, Indium Tin Oxide, Chromium Tin Oxide, Antinomy doped Tin Oxide, Zinc Aluminum Oxide and Zinc Tin Oxide.

Next, a first electrode 26 is formed on the bottom surface (not shown) of the substrate 10, and the material of the first electrode 26 can be Au/Ge/Ni, Ti/Al, Tl/Al/Ti/Au or Cr/Au alloy or combination thereof. Then, a second electrode 28 with thickness of about 2000 um is formed on the transparent conductive layer 24. In this embodiment, the material of second semiconductor layer 16 is P-type GaN semiconductor layer, thus, the material of the second electrode 28 can be Au/Ge/Ni, Ti/Al, Tl/Al/Ti/Au, Cr/Au alloy or W/Al alloy. It is noted that the first electrode 26 and the second electrode 28 are formed by suitable conventional methods, which are not mentioned herein again.

Figure 5A:
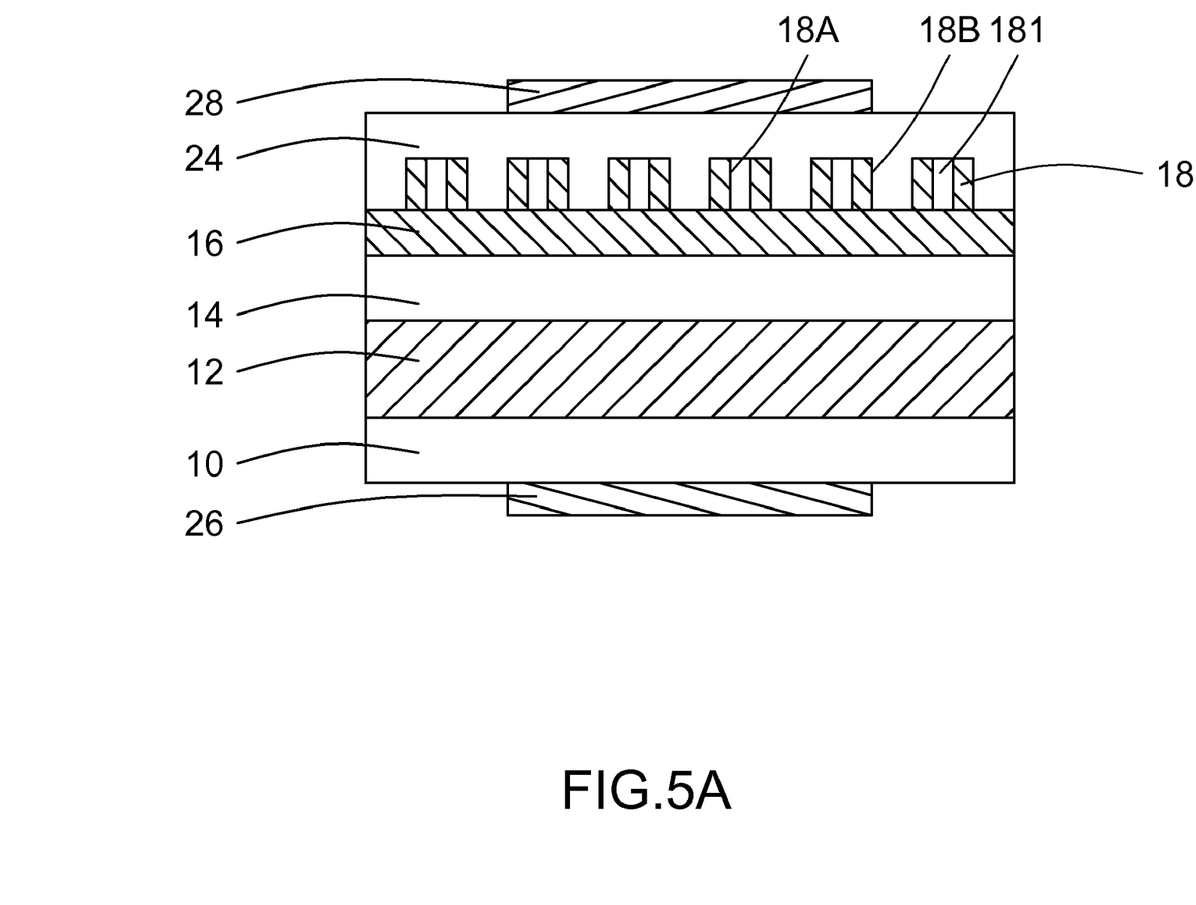
FIG. 5A shows a view of another embodiment of light emitting device having a plurality of pillar structures with hollow structure therein in accordance with the present invention.

FIG. 5A shows a view of another embodiment of a light emitting device having a plurality of pillar structures with a hollow structure. In FIG. 5A, an epi-stacked structure is formed on the substrate 10, which includes: a first semiconductor layer 12 on the substrate 10; an active layer 14 on the first semiconductor layer 12 and a second semiconductor layer 16 on the active layer 14. It should be noted that the manufacture process of the epi-stacked structure is well know in the description above, therefore the detail description of the manufacture process is omitted herein.

After an epi-stacked structure (a first semiconductor layer 12, an active layer 14, and a second semiconductor 16) is formed, a semiconductor process such as photolithography process and etch process is performed. A patterned photoresist layer (not shown) is formed on the second semiconductor layer 16 of the epi-stacked structure to form a plurality of pillar structures with hollow structure. The present invention utilized the depth 181 of the hollow structure that is equal to the height of the pillar structure 18 (as shown in FIG. 3) to illustrate as following. In this embodiment, the current is applied to the electrodes on the first semiconductor layer (n-GaN) 12 and the second semiconductor layer (p-GaN) 16 respectively that can drive the active layer 14 to illuminate, and the light extraction efficiency of the light emitting device can be improved due to the light scattering effective within the plurality of pillar structures 18 with a hollow structure.

Then, a transparent conductive layer 24 is formed on the second semiconductor layer 16 and to cover the plurality of pillar structures 18 with hollow structure. In this embodiment, the thickness of the transparent conductive layer 24 is about 2500 angstrom, and the material of the transparent conductive layer 24 can be Ni/Au, NiO/Au, Ta/Au, TiWN, TN, Indium Tin Oxide, Chromium Tin Oxide, Antinomy doped Tin Oxide, Zinc Aluminum Oxide and Zinc Tin Oxide.

Next, a first electrode 26 is formed on the bottom surface of the substrate 10, and the material of the first electrode 26 can be Au/Ge/Ni, Ti/Al, Tl/Al/Ti/Au or Cr/Au alloy or combination thereof. Then, a second electrode 28 with thickness of about 2000 um is formed on the transparent conductive layer 24. In this embodiment, the material of second semiconductor layer 16 is P-type GaN semiconductor layer, thus, the material of the second electrode 28 can be Au/Ge/Ni, Ti/Al, Tl/Al/Ti/Au, Cr/Au alloy or W/Al alloy. It is noted that the first electrode 26 and the second electrode 28 are formed by suitable conventional methods, which are not mentioned herein again.

Figure 5B:
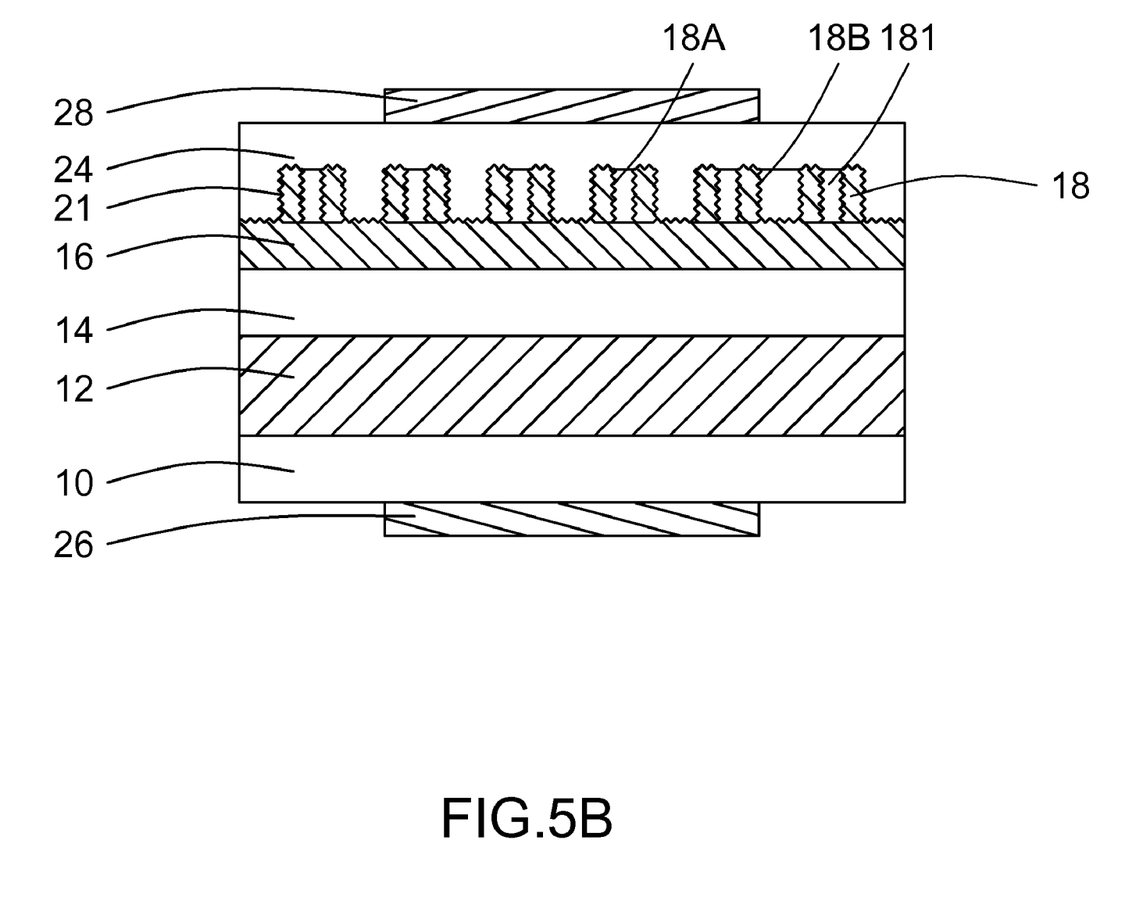
FIG. 5B shows a view of a light emitting device having a plurality of pillar structures with a hollow structure, and the rough surface on the outer surface of the plurality of pillar structure and on the inner surface of hollow structure therein in accordance with the an embodiment of the present invention.

Furthermore, FIG. 5B shows a view of another embodiment of light emitting device having a plurality of pillar structures with a hollow structure, and a rough surface is formed on the outer surface of the plurality of pillar structure and on the inner surface of hollow structure. In FIG. 5B, an epi-stacked structure is formed on the substrate 10, which includes: a first semiconductor layer 12 on the substrate 10; an active layer 14 on the first semiconductor layer 12 and a second semiconductor layer 16 on the active layer 14. It should be noted that the manufacture process of the epi-stacked structure is well known in the description above, and the detail description of the manufacture process is omitted herein. After a plurality of pillar structures 18 with a hollow structure is formed on the second semiconductor layer 16, and a photon assisted etching process is performed to form a rough surface 21 over the exposed surface of the second semiconductor layer 16 and the inner surface 18A and outer surface 18B of the plurality of pillar structures 18. In this embodiment, the purpose of the rough surface 21 is used for increasing the light extraction efficiency which is emitted from the active layer 14 of the light emitting device.

Then, a transparent conductive layer 24 is formed on the second semiconductor layer 16 and to cover the plurality of pillar structures 18 with hollow structure 181. In this embodiment, the thickness of the transparent conductive layer 24 is about 2500 angstrom, and the material of the transparent conductive layer 24 can be Ni/Au, NiO/Au, Ta/Au, TiWN, TN, Indium Tin Oxide, Chromium Tin Oxide, Antinomy doped Tin Oxide, Zinc Aluminum Oxide and Zinc Tin Oxide.

Next, a first electrode 26 is formed on the bottom surface (not shown) of the substrate 10, and the material of the first electrode 26 can be Au/Ge/Ni, Ti/Al, Tl/Al/Ti/Au or Cr/Au alloy or combination thereof. Then, a second electrode 28 with thickness of about 2000 um is formed on the transparent conductive layer 24. In this embodiment, the material of the second semiconductor layer 16 can be the same as the material of the first electrode 26. It is noted that the first electrode 26 and the second electrode 28 are formed by suitable conventional methods, which are not mentioned herein again. Moreover, the manufacture process of the plurality of pillar structures 18 with the depth (181, 183, 185, 187, and 189) within a hollow structure is well known in the description above, therefore the detail description of the manufacture process is omitted herein.

Thus, according to description above, the light scattering efficiency of the active layer can be increased by way of plurality of pillar structure, and the outer rough surface of the plurality of pillar structure and inner rough surface of the hollow structure can increased the light extraction efficiency for the light emitting device.

What is claimed is:

1. A light emitting device, comprising:
    a substrate;
    a first semiconductor layer, formed on said substrate, and said first semiconductor layer having a first region and a second region;
    an active layer, formed on said first region of said first semiconductor layer;
    a second semiconductor layer, formed on said active layer, said second semiconductor layer having a plurality of pillar structures, each of the plurality of pillar structures having a hollow structure therein, and the plurality of pillar structures being separated from each other; and
    a transparent conductive layer covering said plurality of pillar structures with said hollow structure therein, wherein gaps between the plurality of pillar structures are filled with one type of non-gaseous material, the one type of non-gaseous material is the transparent conductive layer, and the one type of non-gaseous material fills at least the top part of the gaps.

2. The light emitting device according to claim 1, wherein each said depth of said hollow structure of each said plurality of pillar structures is identical, and said depth is selected from the group consisting of from said second semiconductor layer downward to an arbitrary depth of said second semiconductor layer therein, from said second semiconductor layer downward to an arbitrary depth of said active layer; from said second semiconductor layer downward to expose a surface of said active layer; from said second semiconductor layer downward through said active layer to expose said first semiconductor layer, and from said second semiconductor layer downward through said active layer to an arbitrary depth of said first semiconductor layer.

3. The light emitting device according to claim 1, wherein each said depth of said hollow structure of each said plurality of pillar structures is different, and said depth is selected from the group consisting of from said second semiconductor layer downward to an arbitrary depth of said second semiconductor layer therein, from said second semiconductor layer downward to an arbitrary depth of said active layer; from said second semiconductor layer downward to expose a surface of said active layer; from said second semiconductor layer downward through said active layer to expose said first semiconductor layer, and from said second semiconductor layer downward through said active layer to an arbitrary depth of said first semiconductor layer.

4. The light emitting device according to claim 1, wherein a portion surface of said second semiconductor layer is a rough surface.

5. The light emitting device according to claim 1, wherein at least one of an inner surface and an outer surface of said hollow structure is a rough surface.

6. The light emitting device according to claim 1, further comprising a first electrode disposed on said second region of said first semiconductor layer.

7. The light emitting device according to claim 1, further comprising a second electrode disposed on said transparent conductive layer.

8. The light emitting device according to claim 1, wherein a portion surface of said second semiconductor layer is exposed from said transparent conductive layer.

9. The light emitting device according to claim 8, further comprising a second electrode disposed on said exposed portion surface of said second semiconductor layer and contacted with said transparent conductive layer.

10. A light emitting device, comprising:
    a substrate;
    a first semiconductor layer, formed on a surface of said substrate;
    an active layer, formed on said first semiconductor layer;
    a second semiconductor layer, formed on said active layer and said second semiconductor layer having a plurality of pillar structures, each of the plurality of pillar structures having a hollow structure therein, and the plurality of pillar structures being separated from each other; and
    a transparent conductive layer covering said plurality of pillar structures with said hollow structure therein, wherein gaps between the plurality of pillar structures are filled with one type of non-gaseous material, the one type of non-gaseous material is the transparent conductive layer, and the one type of non-gaseous material fills at least the top part of the gaps.

11. The light emitting device according to claim 10, wherein each depth of said hollow structure of each said plurality of pillar structures is identical, and said depth is selected from the group consisting of from said second semiconductor layer downward to an arbitrary depth of said second semiconductor layer therein, from said second semiconductor layer downward to an arbitrary depth of said active layer; from said second semiconductor layer downward to expose a surface of said active layer; from said second semiconductor layer downward through said active layer to expose said first semiconductor layer, and from said second semiconductor layer downward through said active layer to an arbitrary depth of said first semiconductor layer.

12. The light emitting device according to claim 10, wherein each depth of said hollow structure of each said plurality of pillar structures is different, and said depth is selected from the group consisting of from said second semiconductor layer downward to an arbitrary depth of said second semiconductor layer therein, from said second semiconductor layer downward to an arbitrary depth of said active layer; from said second semiconductor layer downward to expose a surface of said active layer; from said second semiconductor layer downward through said active layer to expose said first semiconductor layer, and from said second semiconductor layer downward through said active layer to an arbitrary depth of said first semiconductor layer.

13. The light emitting device according to claim 10, wherein a portion surface of said second semiconductor layer is a rough surface.

14. The light emitting device according to claim 10, wherein at least one of an inner surface and an outer surface of said hollow structure is a rough surface.

15. The light emitting device according to claim 10, further comprising a first electrode disposed under a bottom surface of said substrate.

16. The light emitting device according to claim 10, further comprising a second electrode disposed on said transparent conductive layer.

17. The light emitting device according to claim 10, wherein a portion surface of said second semiconductor layer is exposed from said transparent conductive layer.

18. The light emitting device according to claim 17, further comprising a second electrode disposed on said exposed portion surface of said second semiconductor layer and contacted with said transparent conductive layer.

* * * * *